United States Patent
Bandi et al.

(10) Patent No.: US 10,615,893 B1
(45) Date of Patent: Apr. 7, 2020

(54) TRANSMITTER WITH FEEDBACK CONTROL

(71) Applicant: Intel Corporation, Santa Clara, CA (US)

(72) Inventors: Chenchu Punnarao Bandi, Bangalore (IN); Amit Kumar Srivastava, Folsom, CA (US); Michael W. Altmann, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/144,908

(22) Filed: Sep. 27, 2018

(51) Int. Cl.
*H04B 17/24* (2015.01)
*H03G 3/30* (2006.01)
*H04B 15/00* (2006.01)
*H04B 17/10* (2015.01)

(52) U.S. Cl.
CPC .......... *H04B 17/24* (2015.01); *H03G 3/3042* (2013.01); *H04B 15/005* (2013.01); *H04B 17/104* (2015.01)

(58) Field of Classification Search
CPC combination set(s) only.
See application file for complete search history.

(56) References Cited

U.S. PATENT DOCUMENTS

| 5,559,471 A | * | 9/1996 | Black | H03F 1/0222 330/136 |
| 6,272,336 B1 | * | 8/2001 | Appel | H03G 3/3042 455/126 |
| 6,297,685 B1 | | 10/2001 | Ewen et al. | |
| 6,492,874 B1 | * | 12/2002 | Shih | H03F 1/301 330/288 |
| 2003/0038676 A1 | | 2/2003 | Mages | |
| 2008/0122452 A1 | | 5/2008 | Clements et al. | |
| 2014/0152391 A1 | * | 6/2014 | Sowlati | H03F 1/0272 330/296 |

FOREIGN PATENT DOCUMENTS

| EP | 0765037 | 3/1997 |
| KR | 100902608 | 6/2009 |

OTHER PUBLICATIONS

International Search Report & Written Opinion dated Oct. 18, 2019 for PCT Patent Application No. PCT/US2019/039068.

* cited by examiner

*Primary Examiner* — Junpeng Chen
(74) *Attorney, Agent, or Firm* — Green, Howard & Mughal, LLP

(57) ABSTRACT

An apparatus is provided, where the apparatus includes a transmitter comprising a first stage and a second stage, wherein the first stage is to receive an input voltage and generate bias for the second stage, and wherein the second stage comprises a driver circuitry to transmit data using the bias voltage; and a control circuitry to control generation of the bias, based on receiving a feedback of the input voltage.

19 Claims, 7 Drawing Sheets

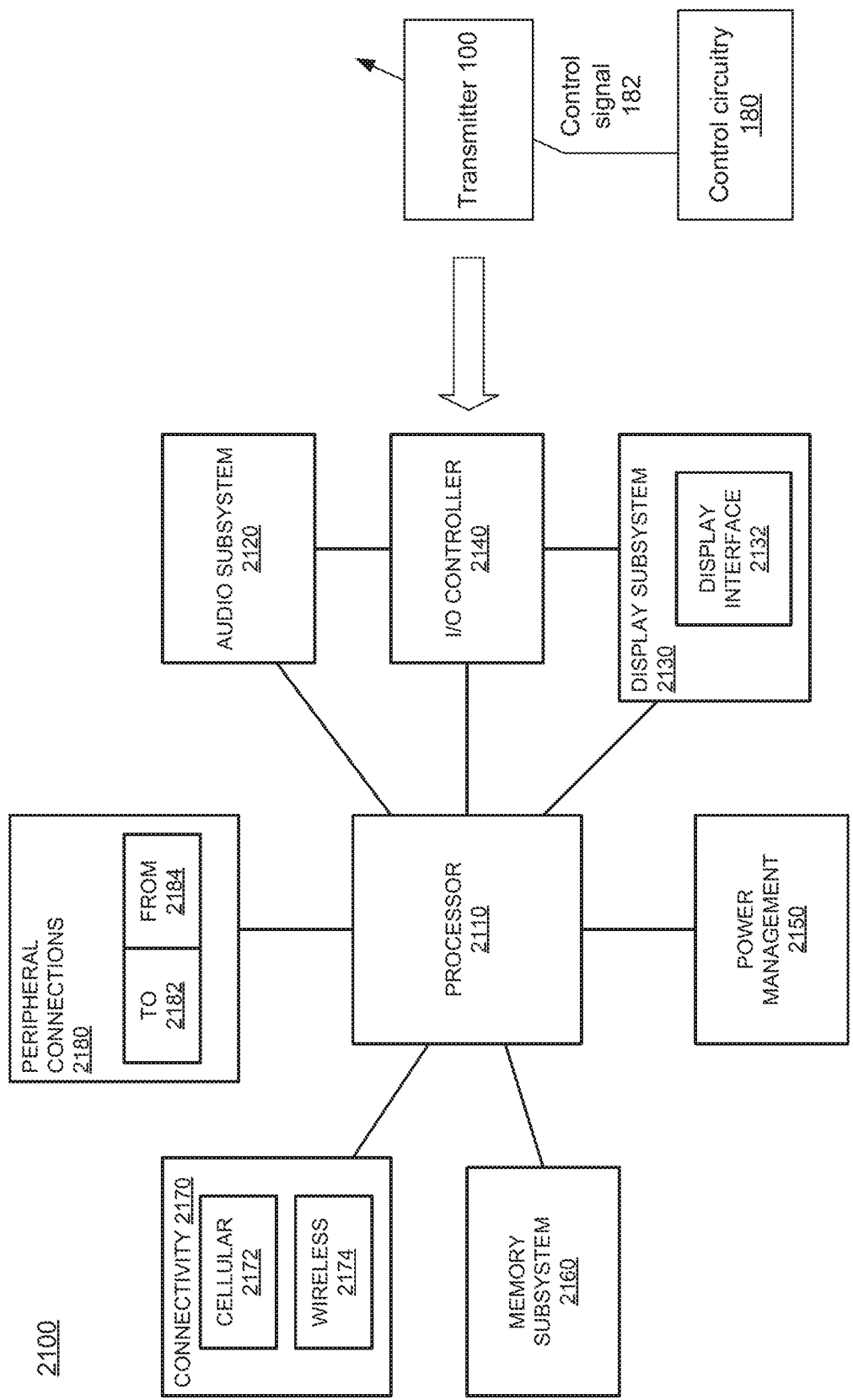

TRANSMITTER WITH FEEDBACK CONTROL

BACKGROUND

High speed data transmitters may suffer Alternating Current (AC) timing loss, eye margin loss, etc., while operating at relatively higher data rates. Such losses may be, among other factors, in order to support long package or board traces, to support higher loading of the devices, etc. The losses may also result due to variation in process, voltage, temperature, product life cycle time, etc.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 7 illustrates a computer system, a computing device or a SoC (System-on-Chip), where a control circuitry uses feedback control to tune generation of bias in a transmitter, e.g., to reduce or mitigate timing losses in the transmitter due to variations of one or more factors, according to some embodiments.

DETAILED DESCRIPTION

Figure 1:
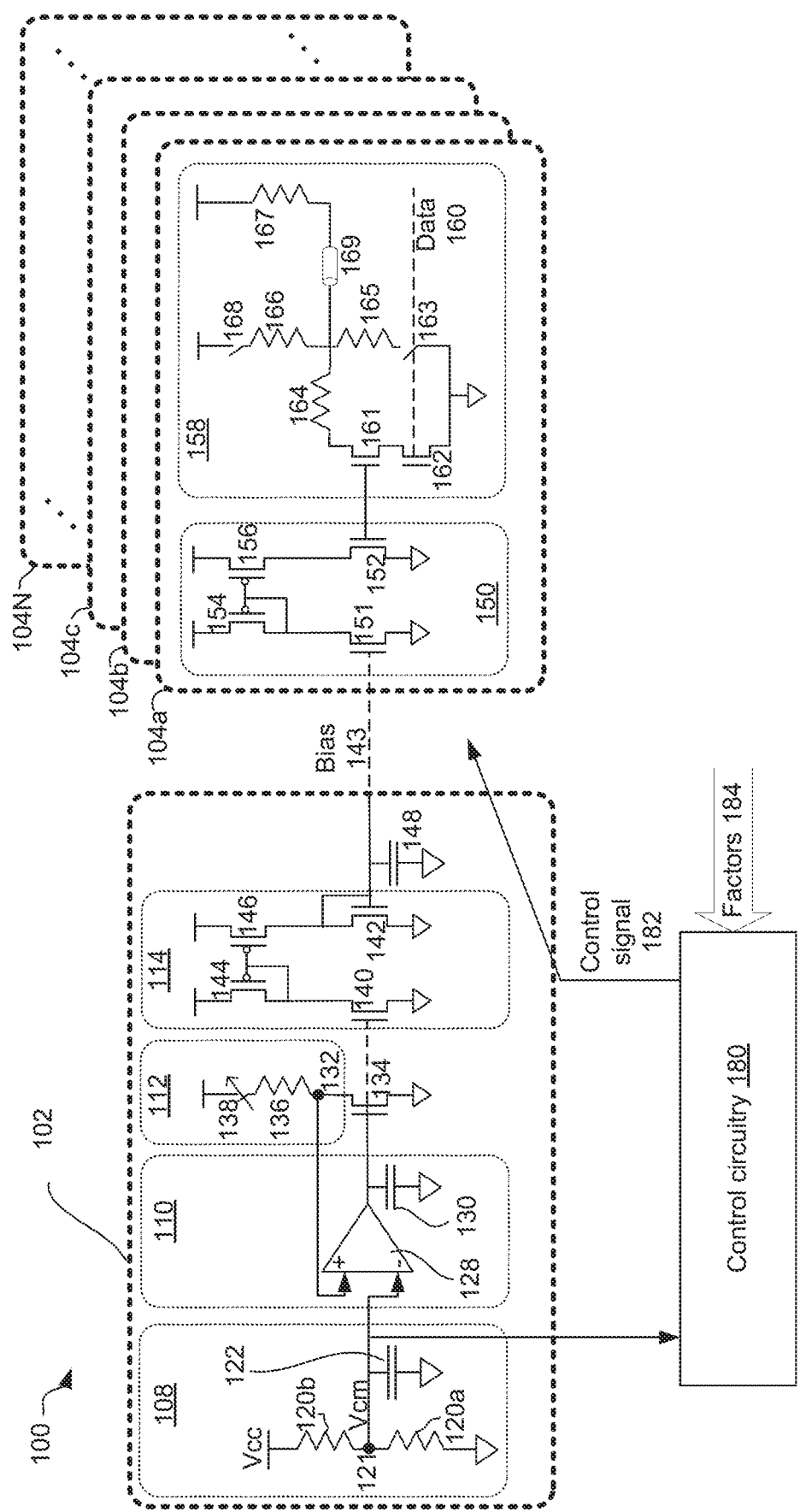
FIG. 1 schematically illustrates a transmitter that incorporates feedback control to tune bias generation in the transmitter, e.g., to reduce or mitigate losses (e.g., AC timing losses, eye margin losses, etc.) due to variations of one or more factors, according to some embodiments.

A transmitter may comprise a first stage to generate bias (e.g., a bias current), and a second stage to drive data to a receiver, where the second stage may operate using the bias generated by the first stage. In an example, performance of the transmitter may degrade due to variation of various factors, e.g., variations in supply voltage, load, temperature, noise in power supply, aging, etc. For example, due to such variations, a system including the transmitter may experience AC timing loss, decline in data eye quality at the receiver, etc.

In some embodiments, in order to mitigate or reduce effects of such variations of the various factors, the bias used in the second stage may be controlled. For example, a control circuitry may receive information on variations of such factors, and may proactively tune or control the bias generation, such that the effects of such variations of the various factors are eliminated or reduced. This may result in enhanced performance of the transmitter, relatively less AC timing loss, better data eye quality, etc. Other technical effects will be evident from the various embodiments and figures.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

It is pointed out that those elements of the figures having the same reference numbers (or names) as the elements of any other figure can operate or function in any manner similar to that described, but are not limited to such.

FIG. 1 schematically illustrates a transmitter 100 that incorporates feedback control to tune bias generation in the transmitter 100, e.g., to reduce or mitigate losses (e.g., AC timing losses, eye margin losses, etc.) due to variations of one or more factors, according to some embodiments. The transmitter 100 may be a high-speed transmitter, e.g., transmitting data at relatively high speed (such as higher than 2 Giga Hertz, merely as an example). The transmitter 100 may be used in any appropriate system that transmits data at a high speed. Merely as an example, the transmitter 100 may be used in conjunction with double data rate (DDR) memory (e.g., to transmit data to the memory, or transmit data from the memory), such as DDR4, DDR5, or any other high-speed transmitters.

The transmitter 100 may be used to transmit streams of one or more bits of data. For example, a section 102 of the transmitter 100 is used for one byte of data. The transmitter 100 also includes sections 104a, 104b, . . . , 104N, where N may be an integer, such as 8, 16, or the like. The section 104a may be used to transmit a stream for a first bit of data, the section 104b may be used to transmit a stream for a second bit of data, and so on. If multiple bytes are to be transmitted in parallel, multiple instances of the transmitter 100 may be used. Thus, the section 102 corresponds to per-byte of data, and individual ones of the sections 104a, 104b, . . . , 104N corresponds to per-bit of data. Thus, the section 102 caters to a byte or 8 bits of data stream, and individual ones of the sections 104a, 104b, . . . , 104N caters to a corresponding bit of data stream.

In an example, the section 102 may be referred to as a first stage of the transmitter 100, and individual ones of the section 104a, 104b, . . . , 104N may be referred to as a second stage of the transmitter 100. Thus, the transmitter 100 comprises a single first stage 102, and a plurality of second stages 104a, 104b, . . . , 104N.

In some embodiments, the section 102 comprises a bias ladder circuitry 108 (also referred to as circuitry 108). The circuitry 108 comprises resistors 120a, 120b coupled between a supply voltage Vcc and ground. A node 121 between the resistors 120a, 120b outputs a common mode voltage Vcm. A capacitor 122 is coupled between the node 121 and the ground terminal.

In some embodiments, the section 102 comprises a regulator circuitry 110 (also referred to as circuitry 110) and a replica circuitry 112 (also referred to as circuitry 112). The circuitry 110 includes a comparator 128, which compares the voltage Vcm of the node 121 to a voltage of a node 132 of the circuitry 112. An output of the comparator 128 is grounded via a capacitor 130. The output of the comparator 128 is also used to control a switch 134, which may be a transistor. The switch 134 is coupled between the node 132 and ground.

The circuitry 112 comprises a resistor 136 coupled between (i) the node 132 and (ii) a supply voltage via a switch 138. In an example, the replica circuitry 112 may be used to replicate one or more resistors of a driver circuitry 158 of the section 104a (or any other section 104b, . . . , 104N), e.g., for purposes of impedance matching.

The section 102 also comprises a buffer 114. The buffer 114 is also referred to as a "per-byte buffer" or as a global buffer, as the buffer 114 supplies bias current for individual ones of the per-bit sections 104a, 104b, . . . , 104N.

In some embodiments, an output of the comparator 128 acts a regulated current source. For example, if various variations in the transmitter 100 are ignored (e.g., PVT variations, variations in the supply voltage Vcc, etc.), then the output of the comparator 128 acts as a regulated constant current source.

The buffer 114 comprises a current mirror, which includes a first pair of switches (e.g., transistors) 140, 142, and a second pair of switches (e.g., transistors) 144, 146. The transistors 144, 140 are coupled in series between a supply and ground terminal, and the transistors 142, 146 are coupled in series between a supply and ground terminal. Gates of the transistors 144, 146 are coupled, and are also coupled to a drain of the transistor 144. A gate of the transistor 140 is coupled to the output of the comparator 128. A gate and a source of the transistor 142 are coupled. The gate of the transistor 142 is grounded via a capacitor 148. The gate of the transistor 142 also provides bias 143 (e.g., bias current 143) to the sections 104a, 104b, . . . , 104N. The buffer 114 may be used to reduce kick-back noise in the transmitter 100, while distributing the bias 143 (e.g., bias current 143) to the sections 104a, 104b, . . . , 104N.

In an example, the sections 104a, 104b, . . . , 104N have substantially similar circuit elements, and merely the section 104a is illustrated in details. In some embodiments, the section 104a comprises a buffer 150, which includes a current mirror. The buffer 150 is also referred to as a "per lane buffer," or a "per bit buffer," as the section 104a is associated with transmission of a single bit sequence.

The current mirror of the buffer 150 is at least in part similar to the current mirror of the buffer 114. For example, the current mirror of the buffer 150 comprises a first pair of transistors 151, 152, and a second pair of transistors 154, 156, arranged in a similar manner as in the buffer 114.

The section 140a comprises a driver circuitry 158, which includes resistors, switches, etc., such as resistors 164, 165, 166, switches 161, 163, 167, 168, etc. The driver circuitry 158 receives data 160, which may be a sequence of 1-bit data, and which drives the switches 162, 163. The component 169 symbolically illustrates communication path (e.g., board traces, package traces, interconnect structures, and/or other routing structures) between the transmitter and a receiver. The transmitter output is also labelled. The receiver includes a resistor 167.

In practice, the transmitter 100 may suffer from various variations, e.g., process, voltage, temperature (PVT) variations, variation in supply voltage Vcc, aging of the transmitter 100, variation in power demand in other components outside the transmitter (e.g., which may result in ripples or spikes in the supply voltage Vcc), and/or other variations within or external to the transmitter 100. In some embodiments, the transmitter 100 may communicate with a control circuitry 180 (also referred to as circuitry 180) that is to reduce or mitigate effects of such variations. The control circuitry 180 may be external to the transmitter 100, or may be included in and be part of the transmitter 100.

Merely as an example and assuming that the circuitry 180 is absent, the supply voltage Vcc may vary between 1.05 volts (V) to 1.35 V (e.g., due to a variation in a loading of the transmitter 100, due to inherent variation of the supply voltage Vcc, etc.), which may result in variations of the output current of the transmitter 100 by about 1.72 milli-Ampere (mA). Such a variation may result worst cases data eye height loss of 98 milli-volts (mV), worst case power loss per channel of 68.8 mA, worst case power loss per eight channel of 550.4 mA, and percentage of power loss at a System on a Chip (SOC) of 6.55%. Thus, variations of the supply voltage Vcc may result in reduced quality of data eye at the receiver, and may result in power loss.

Ideally (e.g., when process, voltage, temperature (PVT) variations, variation in voltage Vcc, aging of the transmitter, variation in power demand in other components outside the transmitter, and/or other variations within or external to the transmitter 100 are ignored), the voltage Vcm output by the bias ladder circuitry 108 may be maintained at a constant voltage, and the bias 143 from the section 102 to the sections 104a, 140b, . . . , 104N are to be constant, thus resulting in proper operation of the transmitter 100. However, in practice, due to PVT variations, supply voltage variations, and/or variations of other factors discussed herein, the bias current 143 may not be maintained at a constant or ideal value, which may result in AC timing loss, eye margin loss, etc. at the receiver end of the transmitter 100. In some embodiments, to mitigate or reduce such losses, the transmitter 100 comprises the control circuitry 180, which may receive feedback of the voltage Vcm, may receive feedback for various factors 184, and may tune or control the section 102. Such tuning of the section 102 may result in tuning the bias 143, which may reduce or mitigate the losses discussed herein above.

For example, the circuitry 180 may generate a control signal 182, to control or tune one or more components of the section 102. Merely as an example, the control signal 182 may be a bias control signal that controls the bias current 143 generated by the buffer 114.

Although FIG. 1 illustrates a specific example implementation of the transmitter 100, the internal structure of the transmitter may be different, as would be appreciated by those skilled in the art. For example, instead of generating the bias 143 in the form of a bias current via the current mirror within the buffer 114, a bias voltage may be generated (e.g., which may be used to bias the sections 104a, 104b, . . . , 104N). Any other appropriate variations of the transmitter 100 may also be possible.

Figure 2:
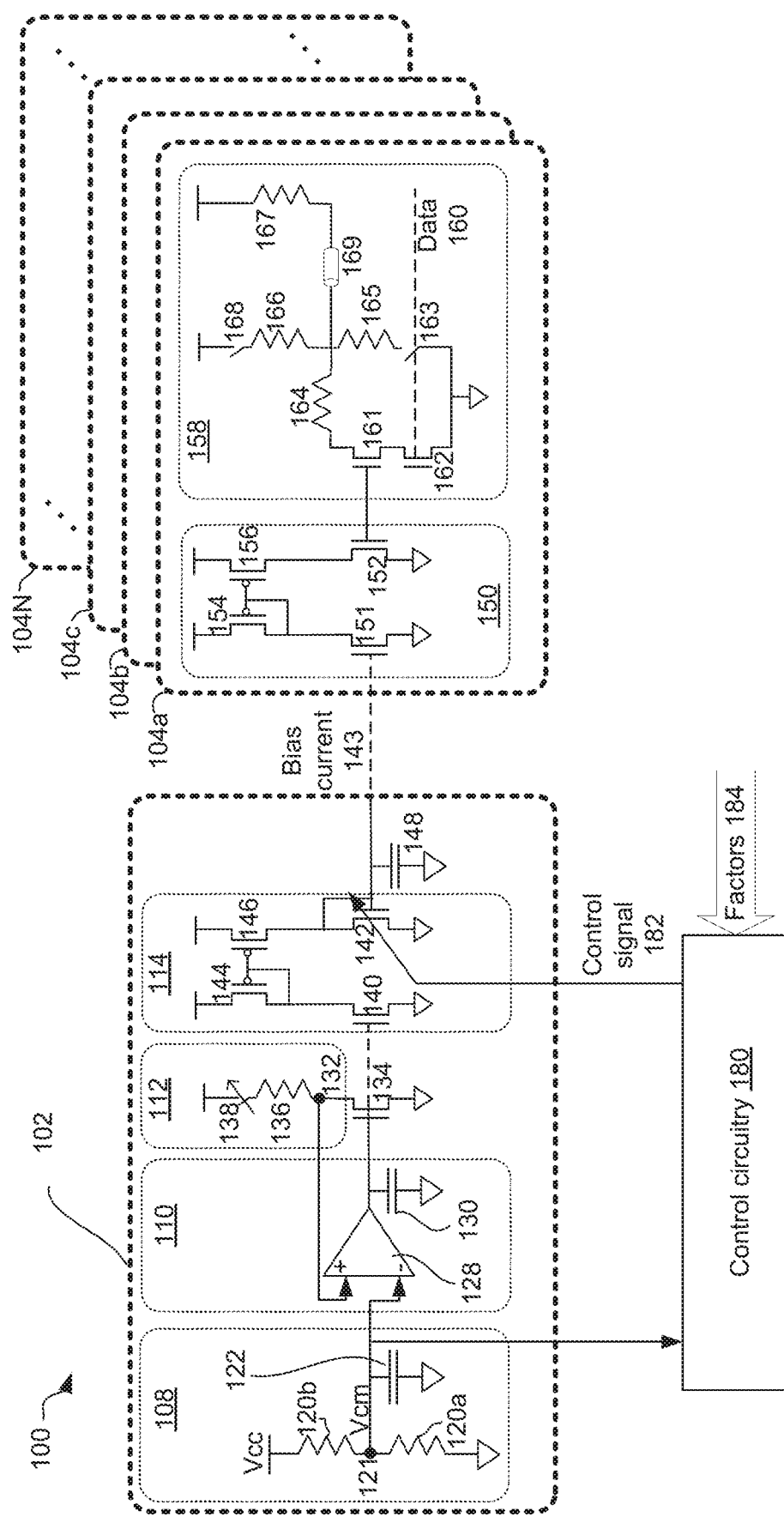
FIG. 2 illustrates an example control of a transmitter by a control circuitry, according to some embodiments.

FIG. 2 illustrates an example control of the transmitter 100 by the control circuitry 180, according to some embodiments. For example, as discussed with respect to FIG. 1, the control signal 182 generated by the circuitry 180 may be used to control one or more components of the section 102, such that the bias 143 generated by the section 102 may be controlled. In the example of FIG. 2, the control signal 182 may be used to control the transistor 142 of the current mirror of the buffer 114. For example, controlling the switching of the transistor 142 may result in controlling the bias 143.

Although FIG. 2 illustrates the circuitry 180 controlling the transistor 142, in other examples, the circuitry 180 may control one or more other appropriate components of the section 102 as well, e.g., to control the bias 143. For example, instead of (or in addition to) controlling the transistor 142, the circuitry 180 may also control the transistor 140, control the supply voltage Vcc, control values of resistances of the resistors 120a and/or 120b, and/or the like.

Figure 3:
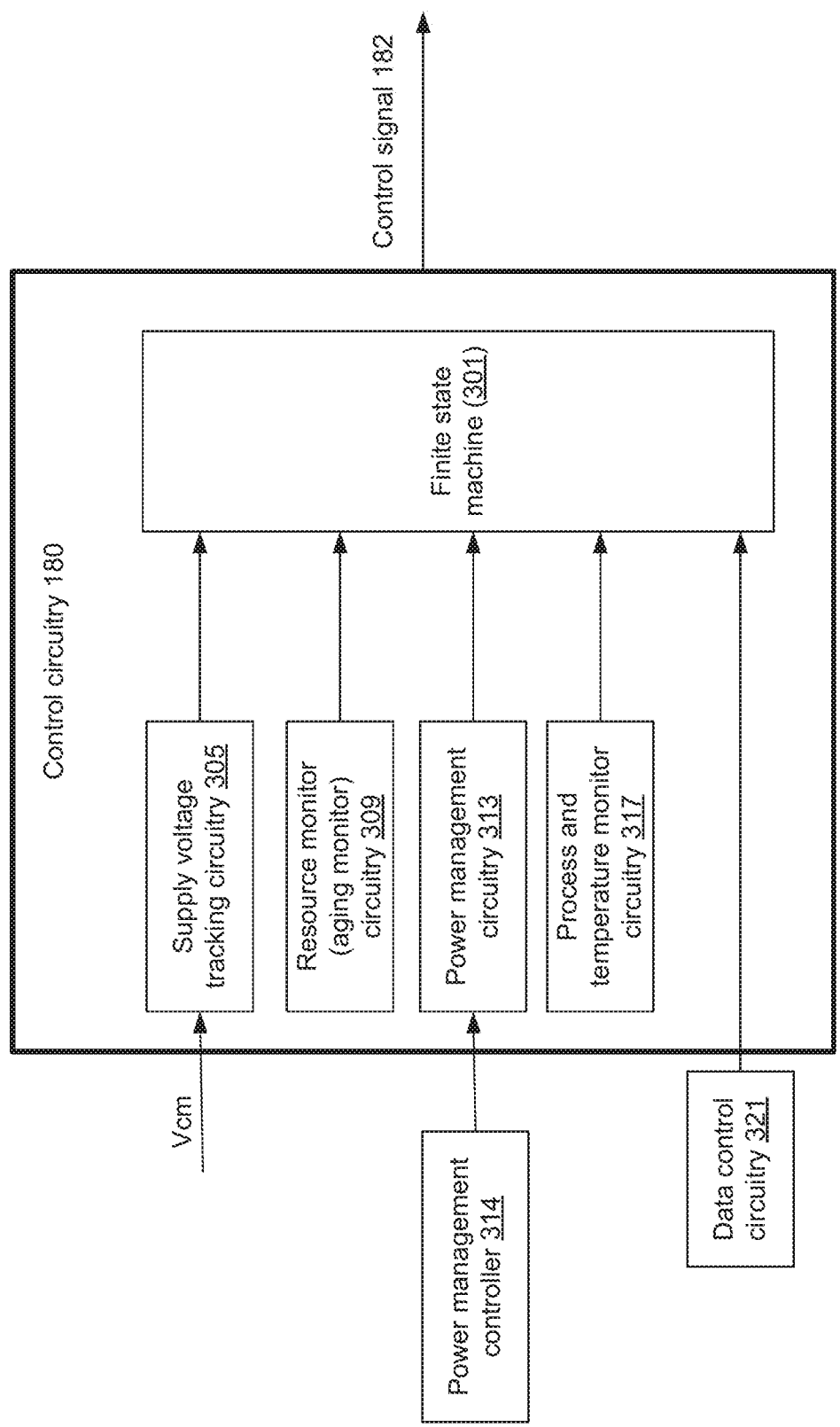
FIG. 3 illustrates a control circuitry of a transmitter in details, according to some embodiments.

FIG. 3 illustrates the control circuitry 180 of the transmitter 100 in further details, according to some embodiments. In some embodiments, the circuitry 180 includes a finite state machine (FSM) 201 to control one or more operations of the circuitry 180, although the FSM 301 may be replaced by other circuitry or logic in another example. In some embodiments, the FSM 301 outputs the control signal 182, which may be used to control the section 102 of the transmitter, as discussed with respect to FIG. 1.

In some embodiments, the circuitry 180 comprises supply voltage tracking circuitry 305 (also referred to as circuitry 305), which receives a feedback of the common mode voltage Vcm from the output of the bias ladder 108, and tracks variations of the voltage Vcm. For example, an output of the circuitry 305 may be indicative of variations in the voltage Vcm, which the FSM 301 may use to generate the control signal 182. For example, the FSM 301 may generate the control signal 182, such that effects of variation of the voltage Vcm may be eliminated or reduced.

Variations of Vcm may result from variations of the supply voltage Vcc and/or may result from variations in loading of the transmitter 100. Hence, the circuitry 305 in effect tracks variations of the supply voltage Vcc and/or variations in loading of the transmitter 100, and the FSM 301 eliminates or reduces effects of such variations via the control signal 182.

In some embodiments, the circuitry 180 comprises resource monitor circuitry 309. In an example, the resource monitor circuitry 309 tracks various resources of a computing device in which the transmitter 100 is included, and provides feedback to the FSM 301. Merely as an example, the resource monitor circuitry 309 tracks gradual aging of various components of the computing device, including aging of the transmitter 100. The aging of various components may result in gradual deterioration or degradation of one or more of the components, which may result in variation of, for example, frequency, voltage, current, tuning, gain, bandwidth, frequency, etc. associated with the components. The resource monitor circuitry 309 monitors and tracks such aging related variations, and the FSM 301 aims to mitigate or reduce effects of such aging related issues via the control signal 182. In such an example, the resource monitor circuitry 309 may also be referred to as aging monitor circuitry.

In an example, in addition to (or instead of) tracking and monitoring aging related issues, the resource monitor circuitry 309 may monitor other aspects of various components, e.g., addition of (or removal of) one or more components in the computing device, tuning or change in configuration of various components of the computing device, and/or any other change in the various components of the computing device, e.g., such that the FSM 301 may mitigate effects of such changes.

In some embodiments, the circuitry 180 comprises a power management circuitry 313 (also referred to as circuitry 313), which may warn the FSM 301 about potential power supply noise. In an example, the circuitry 313 may communicate with a power management controller 314. For example, assume that the transmitter 100 and one or more other components of a computing device share the same power supply, where the one or more other components may be a Universal Serial Bus (USB) device, a Peripheral Component Interconnect Express (PCIe) device, a memory, a transceiver, and/or any other appropriate component(s). Assume that one or more of these components are turned on, turned off, transitions to a low-power or high-power state, etc.—e.g., there is a change in power demand of one or more of these components. Any change in the power demand, and resultant power consumption of one or more of these components may result in noise in the power supply Vcc of the transmitter (e.g., due to overshoot or undershoot, droop, etc. in the supply voltage Vcc). The power management controller 314 may forewarn the circuitry 313 about a state change in one or more of these components, e.g., warn about possible changes in power demand of one or more of these components and/or resultant power supply noise. When the FSM 301 receives such warning about possible power supply noise, the FSM 301 may mitigate such effects of noise via the control signal 182.

Merely as an example, the FSM 301 may temporarily cause the bias current 143 to be higher, e.g., such that the effects of the power supply noise are reduced or eliminated. Temporarily increasing the bias current 143 (e.g., until the noise in the power supply Vcc is reduced or eliminated) may temporarily increase power consumption, but may result in better performance (e.g., data eye in the receiver corresponding to the transmitter 100 has less loss).

In some embodiments, the FSM 301 may include look-up tables which stores various corrective actions to be taken, based on the output of the circuitry 313. For example, if the circuitry 313 indicates that two USB devices (e.g., which are in the same power supply as the transmitter 100) are to be activated, then the FSM 301 may take a first corrective step via the control signal 182; and if the circuitry 313 indicates that one USB device is to be deactivated, then the FSM 301 may take a different corrective step via the control signal 182. Such corrective steps may be based on the look-up table accessed by the FSM.

In some embodiments, the circuitry 180 may include a process and temperature monitor circuitry 317 (also referred to as circuitry 317). The circuitry 317 may monitor process and/or temperature variations of various components of the computing devices (e.g., in which the transmitter 100 is included), and the FSM 301 may take corrective actions. For example, in response to a rise in temperature, the FSM 301 may change the bias, such that the increase in the temperature does not adversely affect the quality of the data eye at the receiver.

In some embodiments, the circuitry 180 may include, or receive signal from, a data control circuitry 321 (also referred to as circuitry 321). The circuitry 321 may be external to the circuitry 180, as illustrated in FIG. 3; or the circuitry 321 may be internal to the circuitry 180.

In some embodiments, the circuitry 321 may track a density of data, frequency of data, etc. transmitted by the transmitter 100. For example, the circuitry 321 may be a memory controller (or communicate with a memory controller). For example, if the transmitter 100 is transmitting data to a memory, the circuitry 321 may be the memory controller (or communicate with the memory controller), and keep track of data density. Based on the density of data to be transmitted by the transmitter 100, the FSM 301 may tune or control the bias of the transmitter 100, so as to mitigate effects of data dependent noise due to varying data density.

Merely as an example, the data density may refer to the number of 1's and 0's transmitted by the transmitter 100. Merely as an example, the data density may refer to a frequency with which 1's and 0's are transmitted by the transmitter 100. For example, a higher number of 1's in the data transmitted by the transmitter 100 may entail a first bias control of the transmitter 100 by the FSM 301, and a higher number of 0's in the data transmitted by the transmitter may entail a second bias control of the transmitter 100 by the FSM 301, where the first and second bias controls may be different. For example, the FSM 301 may get indication of frequency component of data to be transmitted, and generate compensation used to mitigate or reduce various data dependent noise.

In some embodiments, the FSM 301 may give different weightage to different ones of the circuitries 305, 309, 313, 317, 321, when generating the control signal 182 to control the bias of the transmitter 100. In an example, the output of the resource monitor or aging monitor circuitry 305 may be varying relatively slowly with time, and the FSM 301 may react relatively slowly to a change in the output of the circuitry 305 (e.g., as the transmitter 100 may not change suddenly due to aging). On the other hand, the FSM 301 may act relatively fast to changes to the output of the circuitry 321, as the output of the circuitry 321 may change relatively fast and dynamically with changes in data transmitted by the transmitter 100. In an example, the FSM 301 may provide higher weightage to the output of the circuitry 305, as the output of the circuitry 305 may be indicative of variation in the supply voltage Vcc, which may have higher impact on the bias 143 supplied by the section 102 of the transmitter 100.

Although FIG. 3 illustrates example circuitries 305, . . . , 321 (e.g., output of which may be used by the FSM 301 to generate the control signal 182), in some embodiments, output of any other appropriate circuitry may be used by the FSM 301 to generate the control signal 182. Thus, the FSM 301 may track any other appropriate type of parameter variation(s) in a computing device comprising the transmitter 100, and generate the control signal 182 to mitigate or reduce effects of such parameter variation(s). Such parameter variation(s) may include, merely as examples, variations in frequency, gain, bandwidth, and/or the like.

Figure 4:
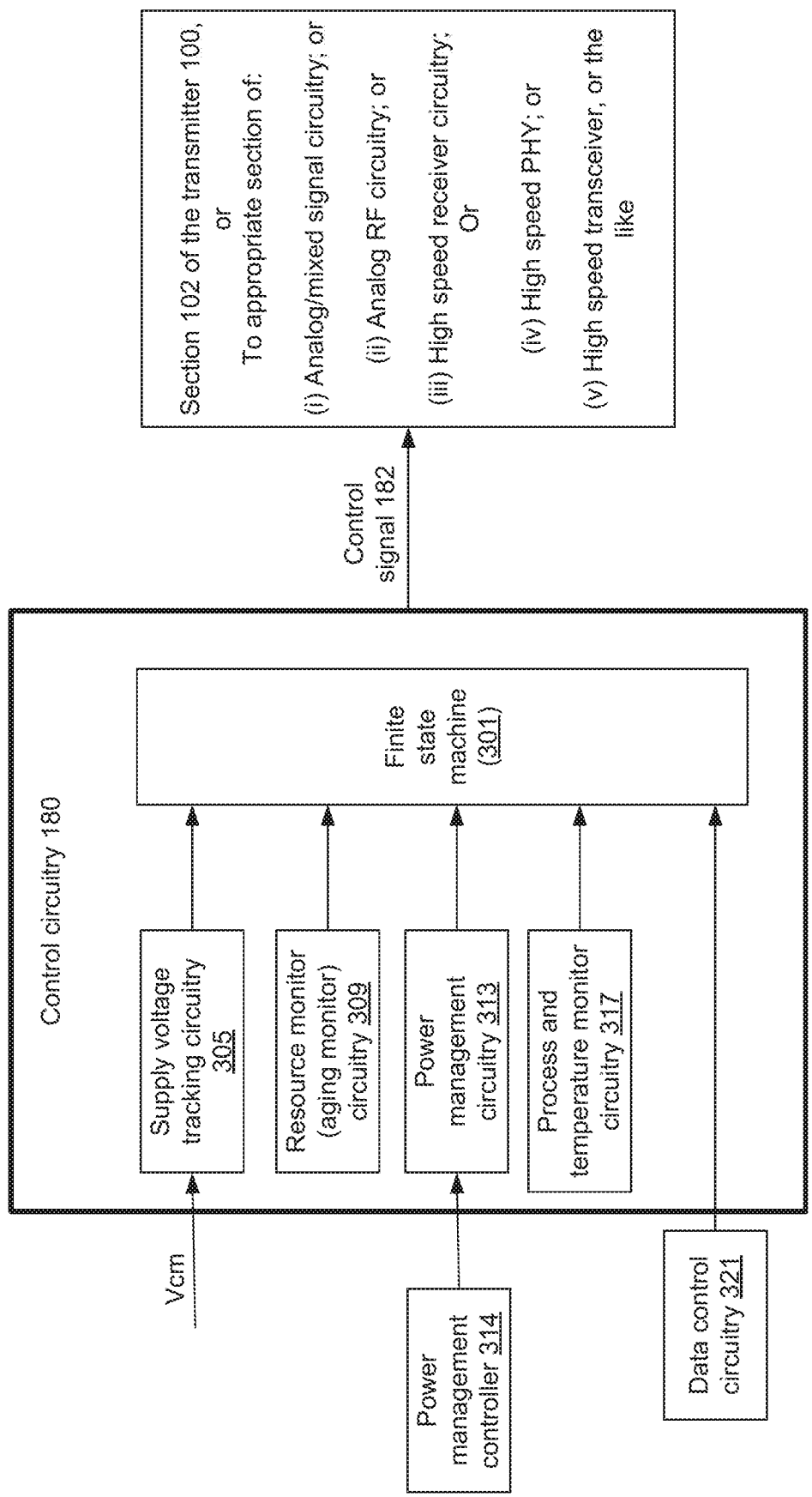
FIG. 4 illustrates some example circuitries with which a control circuitry may be used, according to some embodiments.

In FIGS. 1-3, the FSM 301 is assumed to be used in conjunction with the transmitter 100. However, the FSM 301 may be used for any other type of circuitries. For example, FIG. 4 illustrates some example circuitries with which the control circuitry 180 may be used, according to some embodiments. For example, the control circuitry 180, including the FSM 301 and the circuitries 305, . . . , 321, may be used with the section 102 of the transmitter 100, or with an appropriate section of any of: an analog/mixed signal circuitry; an analog Radio Frequency (RF) circuitry; a high-speed receiver circuitry; a high speed PHY; a high speed transceiver; or the like, as illustrated in FIG. 4.

Figure 5:
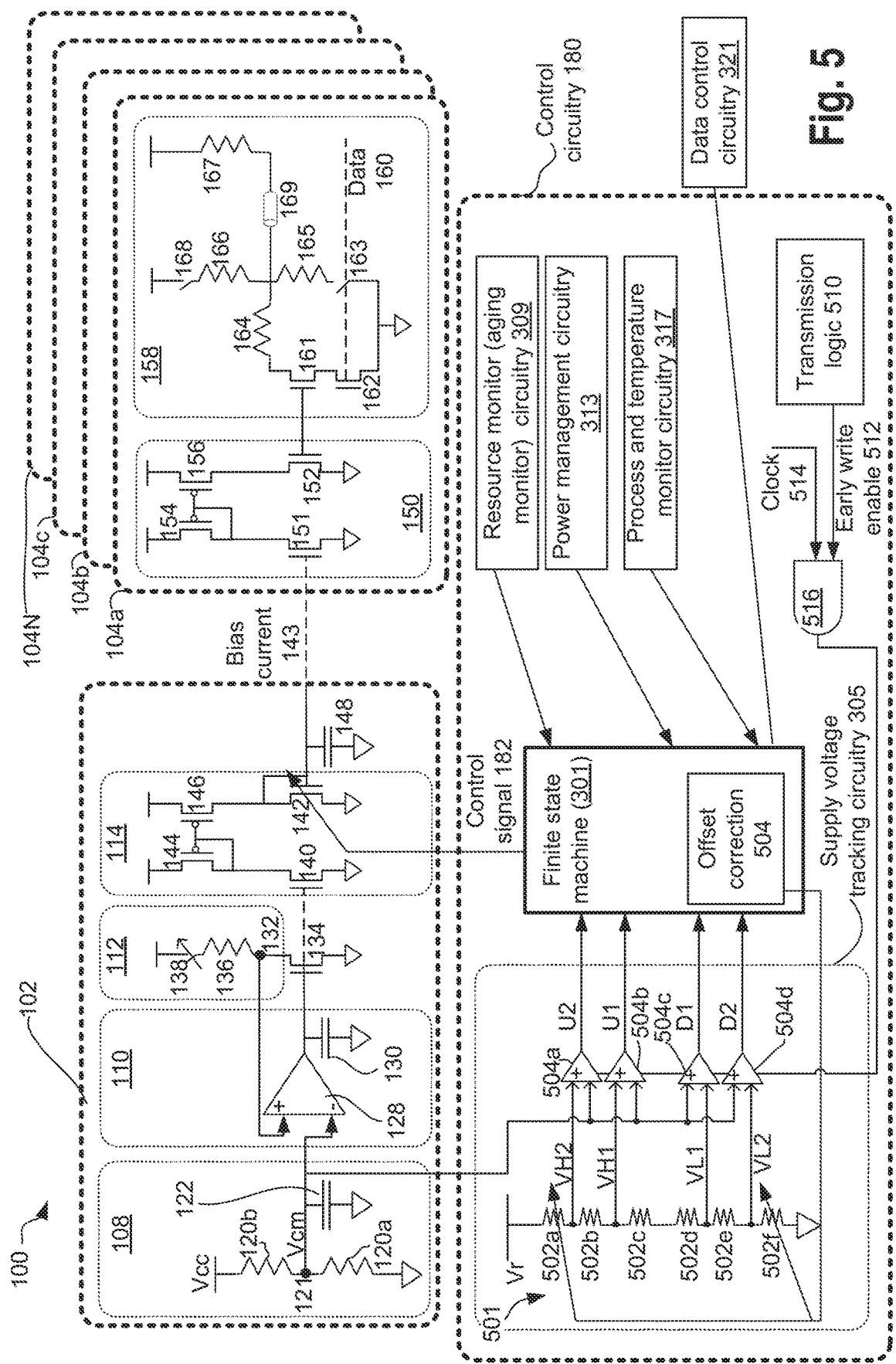
FIG. 5 illustrates an example implementation of a supply voltage tracking circuitry of a control circuitry 180 of a transmitter, according to some embodiments.

FIG. 5 illustrates an example implementation of the supply voltage tracking circuitry 305 of the control circuitry 180 of the transmitter 100, according to some embodiments. The circuitry 305 comprises a tracking ladder 501 comprising resistors 502a, 502b, . . . , 502f. The tracking ladder 501 aims to track the bias ladder circuitry 108.

The tracking ladder 501 is coupled between a voltage Vr and ground terminal. The voltage Vr may be a clean voltage or bandgap voltage (e.g., a reference voltage, or a regulated voltage), e.g., may be relatively more stable and may have a substantially same value over time (e.g., unlike the supply voltage Vcc, the voltage Vr may not fluctuate with time).

The circuitry 305 comprises four comparators 504a, 504b, 504c, and 504d. The comparator 504a receives a voltage VH2 (e.g., at a positive terminal of the comparator) from a node between the resistors 502a and 502b; receives the voltage Vcm from the section 102; and outputs a signal U2.

The comparator 504b receives a voltage VH1 (e.g., at a positive terminal of the comparator) from a node between the resistors 502b and 502c; receives the voltage Vcm from the section 102; and outputs a signal U1.

The comparator 504c receives a voltage VL1 from a node between the resistors 502d and 502e; receives the voltage Vcm from the section 102 (e.g., at a positive terminal of the comparator); and outputs a signal D1.

The comparator 504d receives a voltage VL2 from a node between the resistors 502e and 502f; receives the voltage Vcm from the section 102 (e.g., at a positive terminal of the comparator); and outputs a signal D2.

The voltages VH2, VH1, VL1, VL2 may be based on the voltage Vr, and the values of the resistors 502a, 502b, . . . , 502f. In some embodiments, one or more of the resistors 502a, 502b, . . . , 502f may be tuned by an offset correction logic 504, e.g., to correct any possible offset in the tracking ladder 501. In the tracking ladder 501, VH2>VH1> VL1>VL2.

Individual ones of the signals U1, U2, D1, and D2 may have a value of high or low (e.g., 1 or 0), e.g., based on the comparison in the corresponding comparator. The signals U1, U2, D1, and D2 are received by the FSM 301. The signals U1, U2, D1, and D2, in combination, may provide an indication of the value of the voltage Vcm. For example, in a way, the signals U1, U2, D1, and D2 are a four-bit digital value for the common mode voltage Vcm.

For example, during an offset training stage (e.g., prior to an operation of the transmitter 100, during a start-up of the transmitter 100, and/or at any periodic or aperiodic intervals), the offset correction logic 504 may tune one or more of the resistors 502a, 502b, . . . , 502f for possible offset correction. For example, ideally, it may be intended that an average or steady state value of Vcm is equal to a value of the voltage at a node between the resistors 502c, 502d. This may correspond to a scenario where U2=1, U1=1, D1=1, D2=1. Thus, the offset correction logic 504 may tune one or more of the resistors 502a, 502b, . . . , 502f, until U2=1, U1=1, D1=1, D2=1. Although FIG. 5 illustrates tuning of the resistors 502a and 502f, any of the resistors 502a, 502b, . . . , 502f may be tuned. In an example, during offset training stage, the transmitter 100 may not transmit any data.

In some embodiments, an AND logic gate 516 receives an early write enable signal 512 (e.g., from a transmission logic 510, which is aware of when the transmitter 100 is to transmit data) and a clock 514. An output of the AND gate 516 is used to clock the comparators 504a, 504b, 504c, 504d. The early write enable signal 512 may un-gate the comparators 504a, 504b, 504c, 504d, e.g., few, such as one or two, clock cycles prior to the transmitter 100 transmitting data (or when the transmitter 100 is to transmit data), or during the above discussed training stage. In an example, the frequency of the clock 512 may be similar to, or higher than a write clock, e.g., for generating reasonable sampling rate of voltage Vcm In some embodiments, based on the value of the Vcm, individual ones of the signals U1, U2, D1, D2 may take values of either 0 or 1. The following example scenarios are discussed:

Scenario (A): consider a scenario where U2=1, U1=0, D1=1, D2=1. This may be the case when VH2 is higher than Vcm, Vcm is higher than VH1, VH1 is higher than VL1, and VL1 is higher than VL2 (e.g., VL2<VL1<VH1< Vcm<VH2). Thus, Vcm is higher than it's expected, ideal, or average value. In some embodiments, for such a situation, a corresponding binary bit in control signal 182 may be deselected to reduce the bias 143. If the same samples keep on coming, thermal bits in the control signal 182 may be deselected till U1 flips to 1.

Scenario (B): consider a scenario where U2=0, U1=0, D1=1, D2=1. This may be the case when Vcm is higher than VH2, VH2 is higher than VH1, VH1 is higher than VL1, and VL1 is higher than VL2 (e.g., VL2<VL1< VH1<VH2<Vcm). Thus, Vcm is higher than it's expected, ideal, or average value. In some embodiments, for such a situation, a corresponding binary bit in control signal 182 may be deselected to reduce the bias 143. The reduction of the bias in scenario (B) may be higher than the reduction of bias in scenario (A) (e.g., because the voltage Vcm in scenario (B) is higher than that is scenario (A)). If the same samples keep on coming, the thermal bits in the control signal may be deselected till U2 flips to 1.

Scenario (C): consider a scenario where U2=1, U1=1, D1=0, D2=1. This may be the case when VH2 is higher than VH1, VH1 is higher than VL1, VL1 is higher than Vcm, and Vcm is higher than VL2 (e.g., VL2<Vcm<VL1<VH1<VH2). Thus, Vcm is lower than it's expected, ideal, or average value. In some embodiments, for such a situation, a corresponding binary bit in control signal 182 may be selected to increase the bias 143. If the same samples keep on coming, the thermal bits in the control signal may be selected till D2 flips to 0.

Scenario (D): consider a scenario where U2=1, U1=1, D1=0, D2=0. This may be the case when VH2 is higher than VH1, VH1 is higher than VL1, VL1 is higher than VL2, and VL2 is higher than Vcm (e.g., Vcm<VL2<VL1<VH1<VH2). Thus, Vcm is lower than it's expected, ideal, or average value. In some embodiments, for such a situation, a corresponding binary bit in control signal 182 may be selected to reduce the bias 143. The bias reduction in scenario (D) may be higher than that in the scenario (C), e.g., because the voltage Vcm in scenario (D) is lower than that is scenario (C). If the same samples keep on coming, the thermal bits in the control signal may be deselected till D2 flips to 1.

Scenario (E): consider a scenario where U2=1, U1=1, D1=1, D2=1. This may be the case when VH2 is higher than VH1, VH1 is higher than Vcm, Vcm is higher than VL1, and VL1 is higher than VL2 (e.g., VL2<VL1<Vcm<VH1<VH2). Thus, Vcm is at or near it's expected, ideal, or average value. In some embodiments, for such a situation (e.g., which may be an ideal situation where Vcm is within an ideal range), no corrective action may be taken by the FSM 301 to change the bias 143, based on the output of the supply voltage tracking circuitry 305.

Although U1, U2, D1, D2 are used by the FSM 301 to control the bias 143, the FSM 301 may consider other factors as well (e.g., based on receiving outputs from circuitries 309, . . . , 321) to control the bias 143. Thus, the FSM 301 considers the U1, U2, D1, D2, in combination with outputs from circuitries 309, . . . , 321, while controlling the bias 143.

In some embodiments, the circuitry 305, higher order harmonics of resonant frequencies of the voltage Vcm may be filtered out. The samplers in the circuitry 305 may be designed with smaller clock and wider input common range. In order to mitigate the kick back noise due to sampler switching, the samples may be taken in the order of U1, D2, U2, followed by D1, which may provide settling time of Vcm and setting time of the comparison operations.

Thus, the FSM 301 may be able to maintain the bias 143 of the transmitter 100 at an appropriate level (e.g., which may result in higher quality data eye at the receiver and/or low timing losses), in spite of variations of various factors, e.g., variations in supply voltage Vcc, variation in temperature, process, aging of components, turning on or off of various components of the computing device, data density of data transmitted by the transmitter, etc.

Figure 6:
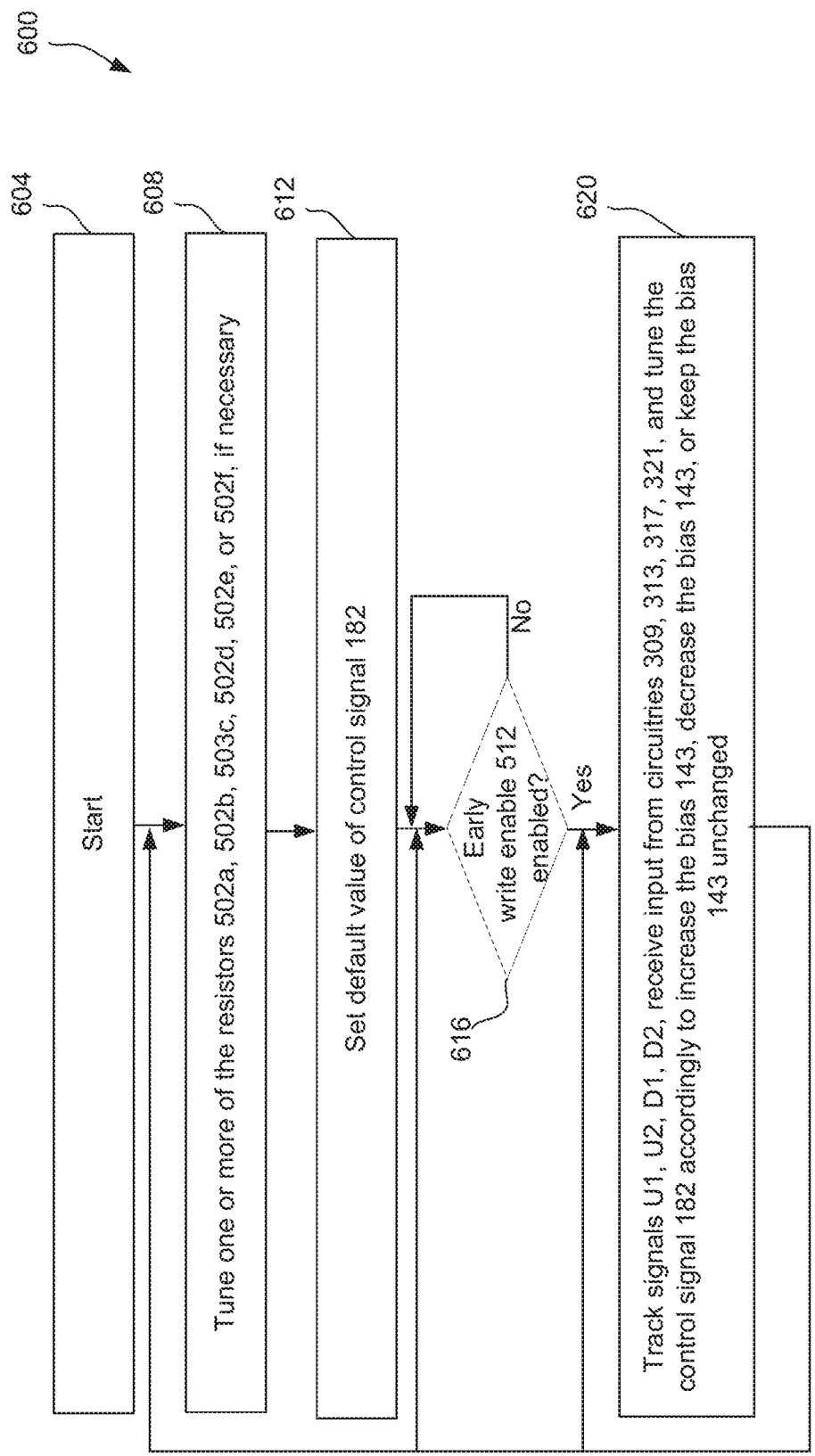
FIG. 6 illustrates a flowchart depicting a method for tuning a bias generation circuitry of a transmitter, according to some embodiments.

FIG. 6 illustrates a flowchart depicting a method 600 for tuning a bias generation circuitry (e.g., section 102) of the transmitter 100, according to some embodiments. Although the blocks in the flowchart with reference to FIG. 6 are shown in a particular order, the order of the actions can be modified. Thus, the illustrated embodiments can be performed in a different order, and some actions/blocks may be performed in parallel. Some of the blocks and/or operations listed in FIG. 6 may be optional in accordance with certain embodiments. The numbering of the blocks presented is for the sake of clarity and is not intended to prescribe an order of operations in which the various blocks must occur.

The method 600 starts at 604. At 608, one or more of the resistors 502a, 502b, 503c, 502d, 502e, or 502f are tuned, if necessary. For example, as discussed herein previously, during the offset training stage (e.g., prior to an operation of the transmitter 100, during a start-up of the transmitter 100, and/or at any periodic or aperiodic intervals), the offset correction logic 504 may tune one or more of the resistors 502a, 502b, . . . , 502f for possible offset correction. For example, ideally, it may be intended that an average or steady state value of Vcm is equal to a value of the voltage at a node between the resistors 502c, 502d. This may correspond to a scenario where U2=1, U1=1, D1=1, D2=1. Thus, the offset correction logic 504 may tune one or more of the resistors 502a, . . . , 502f, until U2=1, U1=1, D1=1, D2=1.

The method 600 then proceeds to 612, where default value of the control signal 182 may be set. The default value of the control signal 182 may be set assuming, merely as an example, that the voltage Vcm is substantially at its steady state or ideal voltage range.

The method 600 then proceeds to 616, where it may be checked whether the early write enable 512 is enabled. For example, as discussed herein previously with respect to FIG. 5, the early write enable signal 512 may un-gate the comparators 504a, 504b, 504c, 504d (e.g., few, such as one or two, clock cycles prior to the transmitter 100 transmitting data, or when the transmitter 100 is to transmit data), or during the above discussed training stage. If the early write enable 512 is not enabled, then the transmitter 100 is not to transmit data, and the method 600 continues checking.

If the early write enable 512 is enabled, then the transmitter 100 is to transmit data, and the method 600 proceeds to 620. At 620, the FSM 301 track signals U1, U2, D1, D2, receives input from circuitries 309, 313, 317, 321, and tunes the control signal 182 accordingly, e.g., to increase the bias 143, decrease the bias 143, or keep the bias 143 unchanged. For example, the FSM 301 tunes the control signal 182 in accordance with one of the above discussed scenarios (A), (B), (C), (D), or (E), discussed with respect to FIG. 5 herein previously.

Subsequently, the method 600 loops back to one of blocks 620, 616, or 608. For example, the method 600 may keep on tracking and tuning, and loop back to 620. Alternatively, the method 600 may loop back to 616, to check if the early write enable 512 is still enabled. Alternatively, if tuning of the resistors 502a, 502b, . . . , 502f is desired (e.g., at periodic or aperiodic intervals, at startup, if an error condition is encountered, etc.), the method 600 may loop back to 608.

FIG. 7 illustrates a computer system, a computing device or a SoC (System-on-Chip) 2100, where the control circuitry 180 uses feedback control to tune generation of bias in the transmitter 100, e.g., to reduce or mitigate timing losses in the transmitter 100 due to variations of one or more factors, according to some embodiments. It is pointed out that those elements of FIG. 7 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 may comprise the transmitter 100 of FIGS. 1-5, and the control circuitry 180. The control circuitry 180 may generate the control signal 182, e.g., to tune the bias generation of the transmitter 100. The transmitter 100 may be used for any appropriate transmission functionality of the computing device 2100, e.g., to transmit data to or from a memory of the memory subsystem 2160, or to transmit data to or from another appropriate component of the computing device 100.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following example clauses pertain to further embodiments. Specifics in the example clauses may be used anywhere in one or more embodiments. All optional features of the apparatus described herein may also be implemented with respect to a method or process.

Example 1

An apparatus comprising: a transmitter comprising a first stage and a second stage, wherein the first stage is to receive an input voltage and generate bias for the second stage, and wherein the second stage comprises a driver circuitry to transmit data using the bias; and a control circuitry to control generation of the bias, based on a feedback of the input voltage.

Example 2

The apparatus of example 1 or any other example, wherein the control circuitry comprises: a first circuitry to track the input voltage; and a second circuitry to control generation of the bias, based on tracking information from the first circuitry.

Example 3

The apparatus of example 1 or any other example, wherein the control circuitry comprises: a first circuitry to track variation of one or more parameters of the apparatus, based on aging of the apparatus; and a second circuitry to control generation of the bias, based on information on the variation of the one or more parameters of the apparatus from the first circuitry.

Example 4

The apparatus of example 1 or any other example, wherein the control circuitry comprises: a first circuitry to track of power demand of one or more components of the apparatus; and a second circuitry to control generation of the bias, based on information on the power demand of the one or more components of the apparatus from the first circuitry.

Example 5

The apparatus of example 1 or any other example, wherein the control circuitry comprises: a first circuitry to monitor one or both of a voltage or a temperature of the apparatus; and a second circuitry to control generation of the bias, based on information on one or both of the voltage or the temperature of the apparatus from the second circuitry.

Example 6

The apparatus of example 1 or any other example, wherein the control circuitry comprises: a circuitry to: receive information on a data density of data to be transmitted by the transmitter, and control generation of the bias, based on the data density of data to be transmitted by the transmitter.

Example 7

The apparatus of example 1 or any other example, wherein the first stage comprises: a buffer including a current mirror, wherein the current mirror is to output the bias in a form of a bias current, wherein to control generation of the bias, the control circuitry is to control the current mirror.

Example 8

The apparatus of example 7 or any other example, wherein the first stage comprises: a bias ladder to receive a supply voltage, and generate the input voltage; a comparator to compare the input voltage with a reference voltage, and generate a first current; and the current mirror to receive the first current at a first transistor, and to output the bias current at a second transistor, wherein to control generation of the bias, the control circuitry is to control the second transistor.

Example 9

The apparatus of example 1 or any other example, wherein the control circuitry comprises: first, second, third, fourth, fifth, and sixth resistors coupled in series between a regulated voltage and ground terminal; a first comparator to receive: an input from a node between the first and second resistors, and the input voltage; a second comparator to receive: an input from a node between the second and third resistors, and the input voltage; a third comparator to receive: an input from a node between the fourth and fifth resistors, and the input voltage; a fourth comparator to receive: an input from a node between the fifth and sixth resistors, and the input voltage; and a Finite State Machine (FSM) to receive: a first comparator output from the first comparator, a second comparator output from the second comparator, a third comparator output from the third comparator, and a fourth comparator output from the fourth comparator.

Example 10

The apparatus of example 9 or any other example, wherein the FSM is to control generation of the bias, based on receiving the first, second, third, and fourth comparator outputs.

Example 11

The apparatus of example 9 or any other example, wherein the first, second, third, and fourth comparators are to be enabled while the transmitter is to transmit data.

Example 12

The apparatus of example 9 or any other example, wherein the FSM is to one of: increase the bias, decrease the bias, or keep the bias unchanged, based on the first, second, third, and fourth comparator outputs.

Example 13

A system comprising: a memory to store instructions; a processor coupled to the memory, the processor to execute the instructions; a wireless interface to facilitate communication between the processor and another system; a transmitter to transmit data to the memory, wherein the transmitter comprises: a driver circuitry to transmit the data to the memory, and a bias generation circuitry to receive an input voltage, and generate a bias current for the driver circuitry; and a bias control circuitry to control the bias current, to compensate for variations of one or more factors, wherein the one or more factors includes one or more of: the input voltage, temperature of one or more components of the apparatus, or the data density.

Example 14

The system of example 13 or any other example, wherein the bias generation circuitry comprises a current mirror that is to receive an input current and generate the bias current, and wherein the input current is generated based on the input voltage.

Example 15

The system of example 14 or any other example, wherein to control the bias current, the bias control circuitry is to control the current mirror.

Example 16

The system of example 13 or any other example, wherein the one or more factors include one or more of: a degradation of the bias generation circuitry due to aging, a power demand of one or more components of the apparatus, or a noise in the input voltage.

Example 17

The system of example 13 or any other example, wherein: the driver circuitry is a first driver circuitry; the transmitter comprises a plurality of driver circuitries, including the first driver circuitry; and the bias generation circuitry is to generate the bias current for the plurality of driver circuitries.

Example 18

An apparatus comprising: a bias generation circuitry to receive an input voltage and generate a bias current; a driver circuitry is to receive the bias current, and to transmit or receive data based on being biased by the bias current; and a control circuitry to track the input voltage, and control generation of the bias current.

Example 19

The apparatus of example 18 or any other example, wherein the control circuitry comprises: a supply tacking circuitry that is to receive the input voltage, and to generate a digital output indicative of the input voltage; and a finite state machine to receive the digital output indicative of the input voltage, and to generate a control signal that is to one of: increase the bias current, decrease the bias current, or retain the value of the bias current, based on the digital output.

Example 20

The apparatus of example 18 or any other example, wherein the bias generation circuitry comprises a current mirror, and wherein the control circuitry is to control the current mirror to control generation of the bias current.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a transmitter comprising a first stage and a second stage,
wherein the first stage is to receive an input voltage and generate bias for the second stage, and
wherein the second stage comprises a driver circuitry to transmit data using the bias; and
a control circuitry to control generation of the bias, based on a feedback of the input voltage, wherein the control circuitry comprises a finite state machine to receive a digital output indicative of the input voltage, and to generate a control signal that is to one of: increase the bias, decrease the bias, or retain the value of the bias, based on the digital output.

2. The apparatus of claim 1, wherein the control circuitry comprises:
a first circuitry to track the input voltage; and
a second circuitry to control generation of the bias, based on tracking information from the first circuitry.

3. The apparatus of claim 1, wherein the control circuitry comprises:
a first circuitry to track variation of one or more parameters of the apparatus, based on aging of the apparatus; and
a second circuitry to control generation of the bias, based on information on the variation of the one or more parameters of the apparatus from the first circuitry.

4. The apparatus of claim 1, wherein the control circuitry comprises:
a first circuitry to track of power demand of one or more components of the apparatus; and
a second circuitry to control generation of the bias, based on information on the power demand of the one or more components of the apparatus from the first circuitry.

5. The apparatus of claim 1, wherein the control circuitry comprises:
a first circuitry to monitor one or both of a voltage or a temperature of the apparatus; and
a second circuitry to control generation of the bias, based on information on one or both of the voltage or the temperature of the apparatus from the second circuitry.

6. The apparatus of claim 1, wherein the control circuitry comprises:
a circuitry to:
receive information on a data density of data to be transmitted by the transmitter, and
control generation of the bias, based on the data density of data to be transmitted by the transmitter.

7. The apparatus of claim 1, wherein the first stage comprises:
a buffer including a current mirror, wherein the current mirror is to output the bias in a form of a bias current, and
wherein to control generation of the bias, the control circuitry is to control the current mirror.

8. The apparatus of claim 7, wherein the first stage comprises:
a bias ladder to receive a supply voltage, and generate the input voltage;
a comparator to compare the input voltage with a reference voltage, and generate a first current; and
the current mirror to receive the first current at a first transistor, and to output the bias current at a second transistor, and
wherein to control generation of the bias, the control circuitry is to control the second transistor.

9. The apparatus of claim 1, wherein the control circuitry comprises:
first, second, third, fourth, fifth, and sixth resistors coupled in series between a regulated voltage and ground terminal;
a first comparator to receive: an input from a node between the first and second resistors, and the input voltage;
a second comparator to receive: an input from a node between the second and third resistors, and the input voltage;
a third comparator to receive: an input from a node between the fourth and fifth resistors, and the input voltage;
a fourth comparator to receive: an input from a node between the fifth and sixth resistors, and the input voltage; and
the Finite State Machine (FSM) to receive: a first comparator output from the first comparator, a second comparator output from the second comparator, a third comparator output from the third comparator, and a fourth comparator output from the fourth comparator.

10. The apparatus of claim 9, wherein the FSM is to control generation of the bias, based on receiving the first, second, third, and fourth comparator outputs.

11. The apparatus of claim 9, wherein the first, second, third, and fourth comparators are to be enabled while the transmitter is to transmit data.

12. The apparatus of claim 9, wherein the digital output is based on the first, second, third, and fourth comparator outputs, and wherein the FSM is to one of: increase the bias, decrease the bias, or keep the bias unchanged, based on the first, second, third, and fourth comparator outputs.

13. A system comprising:
a memory to store instructions;
a processor coupled to the memory, the processor to execute the instructions;
a wireless interface to facilitate communication between the processor and another system;
a transmitter to transmit data to the memory, wherein the transmitter comprises:
a driver circuitry to transmit the data to the memory, and
a bias generation circuitry to receive an input voltage, and generate a bias current for the driver circuitry; and
a bias control circuitry to control the bias current, to compensate for variations of one or more factors, wherein the one or more factors includes one or more of: the input voltage, temperature of one or more components, or the data density, wherein the bias control circuitry comprises a finite state machine to receive a digital output indicative of the input voltage, and to generate a control signal that is to one of: increase the bias current, decrease the bias current, or retain the value of the bias current, based on the digital output.

14. The system of claim 13, wherein the bias generation circuitry comprises a current mirror that is to receive an input current and generate the bias current, and wherein the input current is generated based on the input voltage.

15. The system of claim 14, wherein to control the bias current, the bias control circuitry is to control the current mirror.

16. The system of claim 13, wherein the one or more factors include one or more of: a degradation of the bias generation circuitry due to aging, a power demand of one or more components, or a noise in the input voltage.

17. The system of claim 13, wherein:

the driver circuitry is a first driver circuitry;

the transmitter comprises a plurality of driver circuitries, including the first driver circuitry; and the bias generation circuitry is to generate the bias current for the plurality of driver circuitries.

18. An apparatus comprising:

a bias generation circuitry to receive an input voltage and generate a bias current;

a driver circuitry is to receive the bias current, and to transmit or receive data based on being biased by the bias current; and a control circuitry to track the input voltage, and control generation of the bias current, wherein the control circuitry comprises a supply tracking circuitry that is to receive the input voltage, and to generate a digital output indicative of the input voltage, wherein the control circuitry comprises a finite state machine to receive the digital output indicative of the input voltage, and to generate a control signal that is to one of: increase the bias current, decrease the bias current, or retain the value of the bias current, based on the digital output.

19. The apparatus of claim 18, wherein the bias generation circuitry comprises a current mirror, and wherein the control circuitry is to control the current mirror to control generation of the bias current.

\* \* \* \* \*